United States Patent [19]

Ishida et al.

[11] Patent Number: 4,539,697
[45] Date of Patent: Sep. 3, 1985

[54] FM STEREO DEMODULATING CIRCUIT

[75] Inventors: Kohji Ishida; Tatsuo Numata; Masaharu Sakamoto, all of Tokyo, Japan

[73] Assignee: Pioneer Electronic Corporation, Tokyo, Japan

[21] Appl. No.: 529,773

[22] Filed: Sep. 6, 1983

[30] Foreign Application Priority Data

Sep. 4, 1982 [JP] Japan .................. 57-154223

[51] Int. Cl.³ .............................................. H04H 5/00
[52] U.S. Cl. ........................................... 381/7; 329/126; 455/214
[58] Field of Search ............. 381/4, 7; 455/210, 214; 329/112, 126

[56] References Cited

U.S. PATENT DOCUMENTS

| | | | |
|---|---|---|---|
| 3,617,641 | 11/1971 | Fiet | 381/7 |
| 3,721,766 | 3/1973 | Hilbert | 381/7 |
| 4,049,918 | 9/1977 | Ohsawa | 381/4 |
| 4,074,075 | 2/1978 | Ohsawa | 381/7 |
| 4,140,878 | 2/1979 | Ohsawa | 381/7 |
| 4,274,057 | 6/1981 | Ishida et al. | 381/7 |
| 4,356,350 | 10/1982 | Ienaka | 381/7 |
| 4,390,746 | 6/1983 | Higashiyama et al. | 381/7 |

Primary Examiner—Forester W. Isen
Attorney, Agent, or Firm—Sughrue, Mion, Zinn, Macpeak, and Seas

[57] ABSTRACT

An FM stereo demodulating circuit comprising a pulse counter detector 1 for generating a pulse train signal including the frequency spectrum of the FM signal, DC biasing means for current biasing the detector output about a midpoint, a subcarrier signal generator 2 and current drivers 8, 10 for generating dual polarity biased subcarrier currents, first and second transistor pairs 3, 4, the emitters of each being connected to one of the current drivers, and the bases of the pairs being cross-connected to one of the biased detector outputs, at least one reference transistor pair whose emitters are connected to a current source 11 and whose collectors are connected to each of the biased detector outputs. The currents entering the cross-connected collectors of the first and second transistor pairs, when referenced against the currents into the emitters of the reference transistor pair, produce signals proportional to the right and left channels of the FM signal.

4 Claims, 18 Drawing Figures

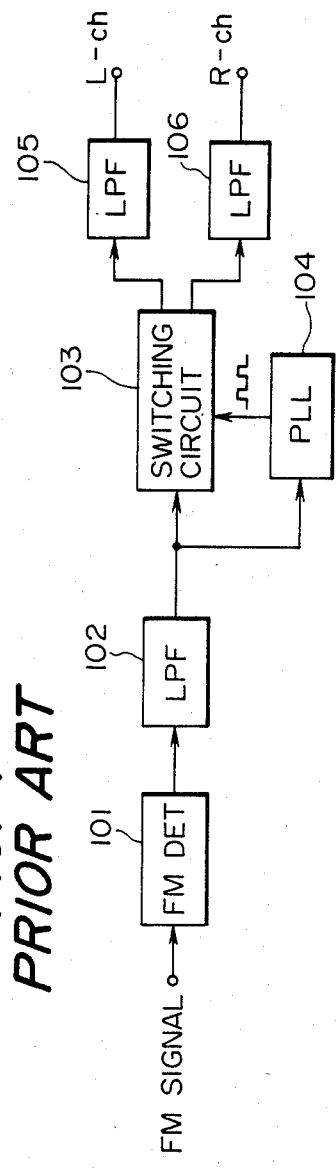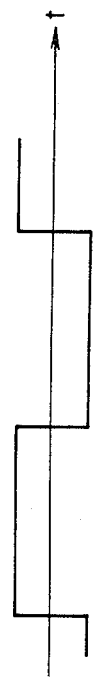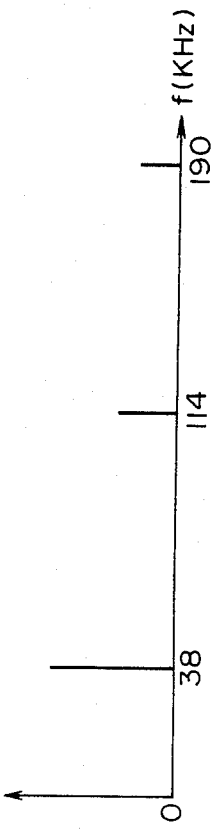
FIG. 1 PRIOR ART
FIG. 2(A) PRIOR ART
FIG. 2(B) PRIOR ART

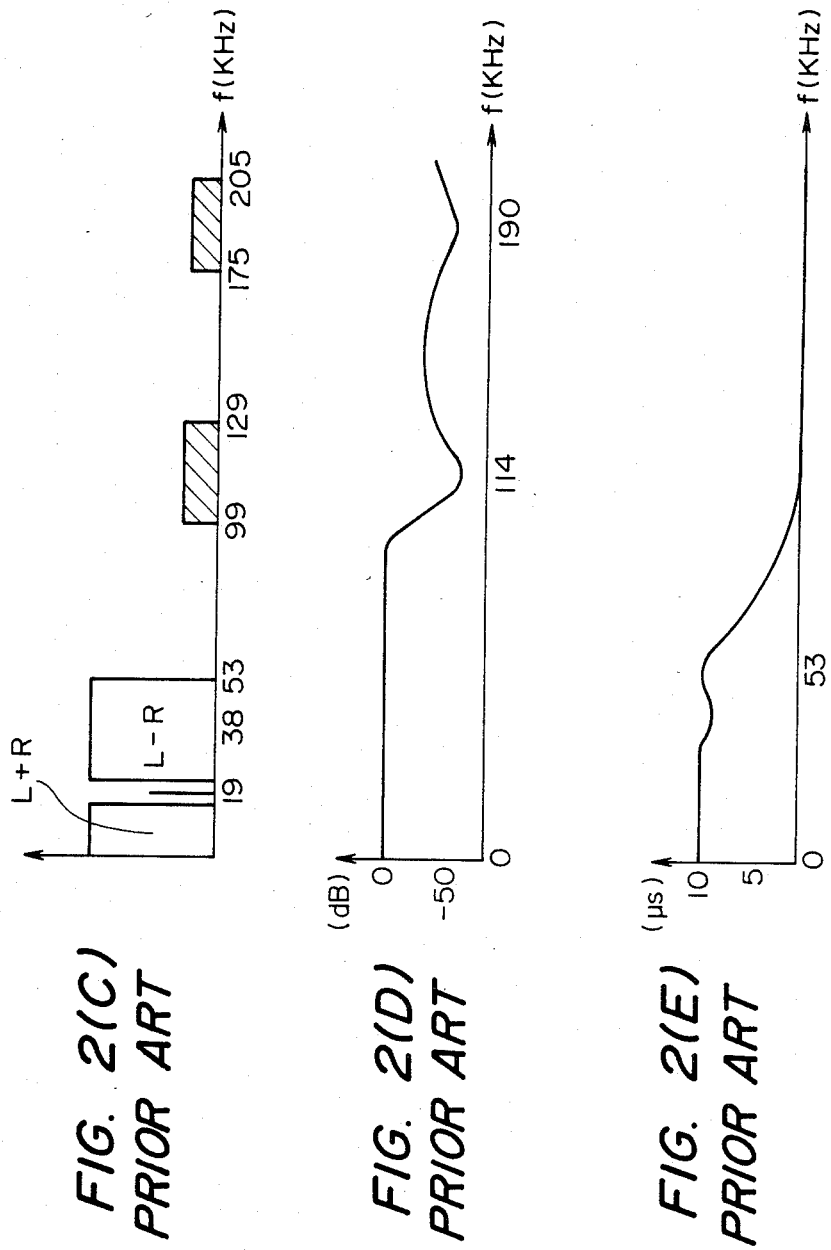

FM STEREO DEMODULATING CIRCUIT

BACKGROUND OF THE INVENTION

The present invention relates to an FM stereo demodulating circuit and particularly to an FM stereo demodulating circuit in which a composite signal is multiplied by a subcarrier signal in demodulating a sub-signal.

A circuit is known for demodulating an FM stereo signal in which a composite signal is subjected to switching by a rectangular subcarrier signal of 38 kHz to separately extract a left and right channel signal from the composite signal. FIG. 1 is a block diagram illustrating such a demodulating system, in which an FM-IF (intermediate frequency) signal is converted into a composite signal by an FM detector 101 and the composite signal is applied to a switching circuit 103 through a low-pass filter (LPF) 102 for eliminating unnecessary components. A pilot signal of 19 kHz contained in the output of the LPF 102 is extracted by a phase-locked loop (PLL) circuit 104. A rectangular subcarrier signal of 38 kHz which is phase-synchronized with the pilot signal is used as a switching signal for the switching circuit 103. LPFs 105 and 106 are used to derive the two audio components from the output of the switching circuit, that is, separate left and right channel signals.

The subcarrier signal of 38 kHz, which is used as the switching signal, is a rectangular wave as shown in FIG. 2(A) and therefore can be expanded in a Fourier series as follows:

$$F(t) = \frac{4}{\pi} \sin\omega_s t + \frac{4}{3\pi} \sin 3\omega_s t + \frac{4}{5\pi} \sin 5\omega_s t + \ldots$$

where $\omega_s$ designates the angular frequency of the subcarrier signal. Thus, the frequency spectrum of the signal F(t) contains odd order harmonics such as 114 kHz, 190 kHz, etc. higher than the fundamental wave of 38 kHz, as shown in the power spectrum of FIG. 2(B).

By switching the FM detection output by the switching signal F(t) having such a frequency spectrum as mentioned above, multiplication is performed on both the signals. If each of the LPFs 5 and 6 is arranged to have a passband between 0 and 15 kHz, the detector output appearing at the stereo output as a result of this multiplication is as shown in FIG. 2(C). Accordingly, signals other than the main signal of 0–15 kHz and the sub-signal of 39±15 kHz, such as noise or nearby electromagnetic disturbances at 114±15 kHz, 190±15 kHz, etc. are demodulated and outputted.

In order to eliminate such a disadvantage, it is necessary to additionally provide an LPF having a large attenuation around the harmonic frequencies of 114 kHz, 190 kHz, etc., as shown in FIG. 2(D) at the output of the FM detector 101. Since the frequency 114 kHz is close to the frequency of the composite signal, there is a disadvantage that the flatness of the delay characteristic of the composite signal is degraded as shown in FIG. 2(E) or the flatness of the amplitude characteristic is degraded due to the inclusion of the additional LPF.

SUMMARY OF THE INVENTION

It is an object of the present invention to eliminate the above-mentioned disadvantage and to provide a stereo demodulating circuit having improved characteristics.

According to the present invention, the FM stereo demodulating circuit comprises a first differential transistor pair constituted by a first and a second transistor with their emitters connected to each other, a second differential transistor pair constituted by a third and a fourth transistor with their emitters connected to each other, a third differential transistor pair constituted by a fifth and a sixth transistor with their emitters connected to each other, a first current control means for controlling a first current supplied to the first differential transistor pair to cause the first current to vary in accordance with a positive phase signal of a sinusoidal subcarrier signal synchronized with a stereo pilot signal in a stereo composite signal which is an FM detection signal. There is also a second current control means for controlling a second current supplied to the second differential transistor pair to cause the current to vary in accordance with a negative phase signal of the sinusoidal wave subcarrier signal. The respective bases of the first, fourth and fifth transistors are supplied with a pulse train signal having a frequency spectrum of the stereo composite signal. The respective bases of the second, third and sixth transistors are supplied with a negative phase signal of the pulse train signal or predetermined biases. Thereby left and right channel signals are obtained by the respective collector currents of at least the first to fifth transistors.

BRIEF DESCRIPTION OF THE DRAWINGS

FIG. 1 is a block diagram of a conventional stereo demodulating circuit;

FIGS. 2(A) through 2(E) are timing and spectrum diagrams for explaining the characteristics of the circuit of FIG. 1;

DETAILED DESCRIPTION OF THE PREFERRED EMBODIMENTS

Figure 3:
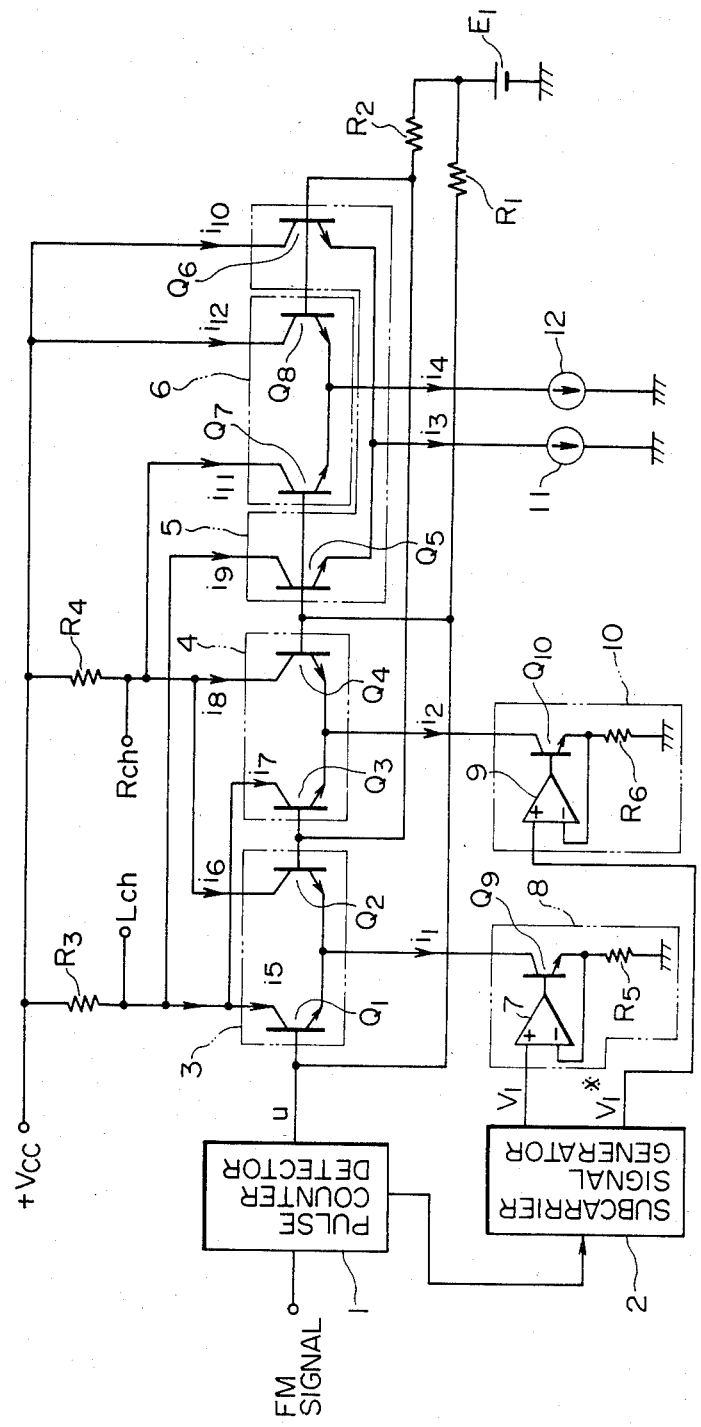
FIG. 3 is a block diagram of the stereo demodulating circuit according to an embodiment of the present invention.
Figure 4A:
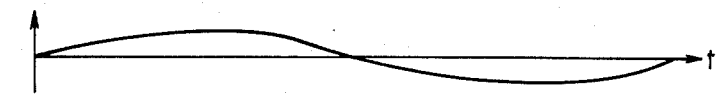
FIGS. 4(A) through 4(J) show waveforms at various points in the circuit of FIG. 3.
Figure 4B:
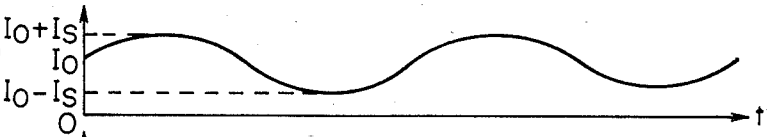
Figure 4C:
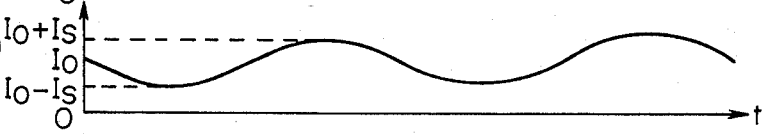
Figure 4D:
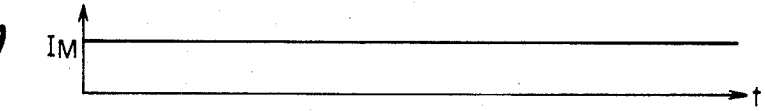
Figure 4E:
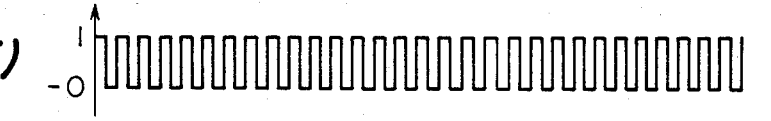
Figure 4F:
Figure 4G:
Figure 4H:
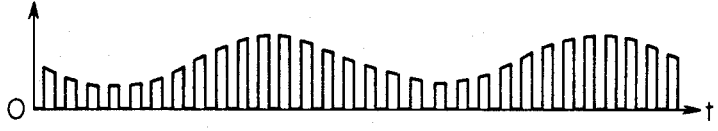
Figure 4I:
Figure 4J:
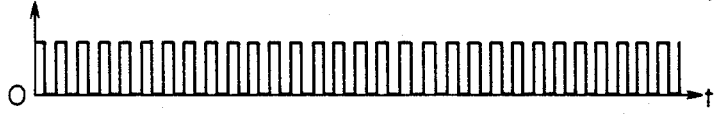
Figure 5:
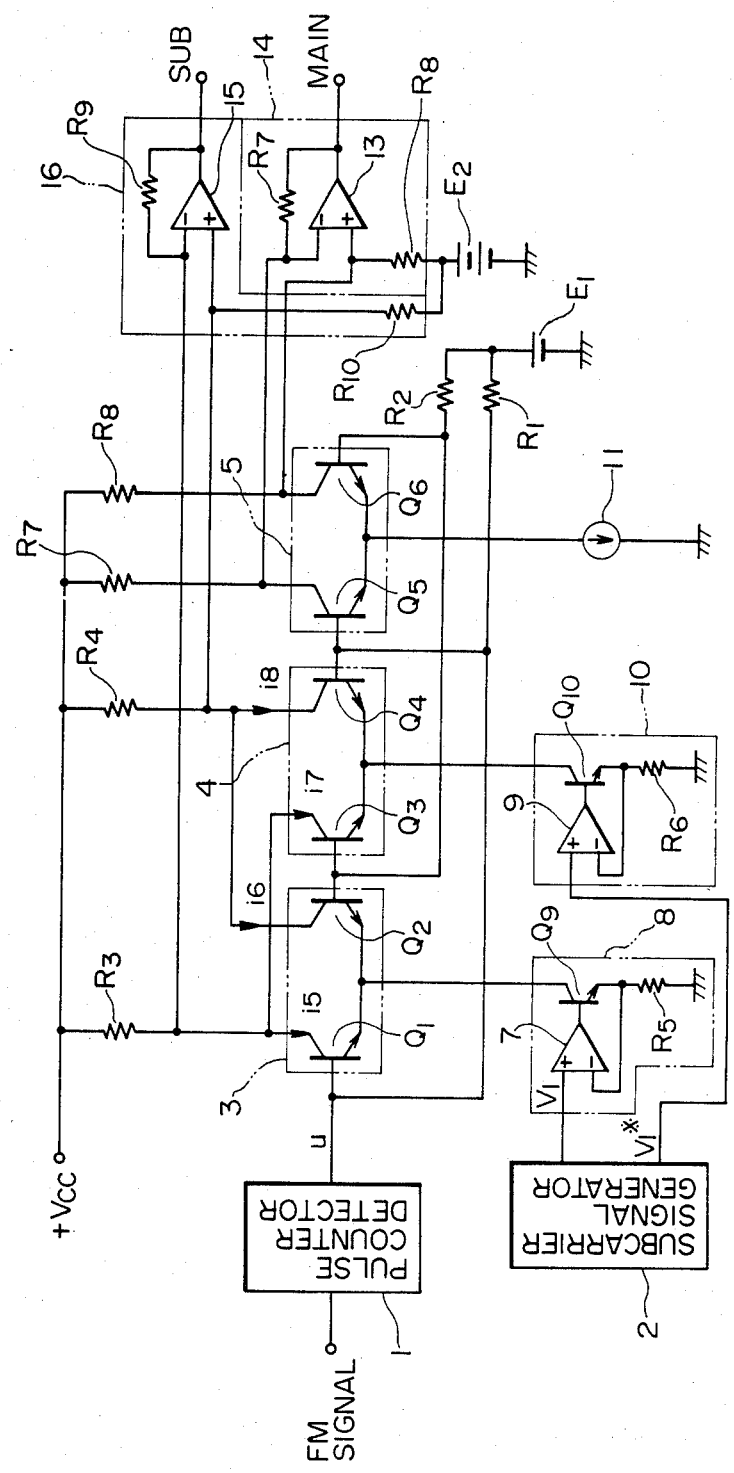
FIG. 5 is a block diagram of the stereo demodulating circuit according to another embodiment of the present invention.

Referring to FIGS. 3 to 5, the present invention will be described in detail.

In FIG. 3, a pulse train signal having a composite signal frequency spectrum is outputted from a pulse counter detector 1 and applied to the respective bases of transistors Q1, Q4, Q5 and Q7. The detector 1 is arranged such that, as well known, a monostable multivibrator is triggered by the leading edge transition timing of the limiter output of the FM-IF signal. The monostable multivibrator of the detector 1 produces a pulse train signal having a predetermined pulse width and being subject to position modulation in accordance with the instantaneous frequency of the FM signal. The pulse train signal in the detector 1 includes the frequency spectrum of the stereo composite signal and is passed through an LPF to produce an FM detector output. This FM detector output is applied, for example, to a subcarrier signal generator 2 comprising a PLL circuit.

A bias voltage E1 is applied through a resistor R1 to the base of each of the transistors Q1, Q4, Q5 and Q7 to which the pulse train is applied as described above. The transistors Q1, Q4, Q5 and Q7 constitute differential transistor pairs 3, 4, 5 and 6, respectively, when paired together with transistors Q3, Q3, Q6 and Q8, respectively. The bias voltage E1 is also applied through a resistor R2 to the base of each of the transistors Q2, Q3, Q6 and Q8. The collectors of the respective transistors Q1, Q3 and Q5 are connected to each other and each of these collectors is supplied with a source voltage +Vcc through a resistor R3. The collectors of the respective transistors Q2, Q4 and Q7 are connected to each other and each of these collectors is supplied with the source voltage +Vcc through a resistor R4. The collector of each of the transistors Q6 and Q8 is directly supplied with the source voltage +Vcc. The collector of a transistor Q9 is connected to the common connection point of the respective emitters of the transistors Q1 and Q2 of the differential transistor pair 3. The emitter of the transistor Q9 is grounded through a resistor R5. The base of the transistor Q9 is supplied with the output of an operational amplifier 7. The negative phase input terminal of the operational amplifier 7 is connected to the emitter of the transistor Q9, so that the operational amplifier 7 constitutes a current control circuit 8 together with the transistor Q9 and the resistor R5. The positive phase input terminal of the operational amplifier 7 is supplied from the subcarrier signal generator 2 with a sinusoidal wave subcarrier signal of 38 kHz which is in synchronism with the stereo pilot signal of 19 kHz included in the FM detector output.

Similarly to the current control circuit 8, a current control circuit 10 constituted by an operational amplifier 9, a transistor Q10 and a resistor R6 is connected between ground and the common connection point of the respective emitters of the transistors Q3 and Q4 of the differential transistor pair 4. The positive phase input terminal of the operational amplifier 9 in the current control circuit 10 is supplied with the signal of opposite phase of the sinusoidal wave subcarrier signal. A constant current source 11 is connected between ground and the common connection point of the respective emitters of the transistors Q5 and Q6 constituting the differential transistor pair 5. A constant current source 12 is connected between ground and the common connection point of the respective emitters of the transistors Q7 and Q8 constituting the differential transistor pair 5. A constant current source 12 is connected between ground and the common connection point of the respective emitters of the transistors Q7 and Q8 constituting the differential transistor pair 6.

A signal based on the voltage across the resistor R3 is derived as a left channel signal from the common collector connection line of the transistors Q1, Q3 and Q5, while a signal based on the voltage across the resistor R4 is derived as a right channel signal from the common collector connection line of the transistors Q2, Q4 and Q7.

In the thus arranged circuit, assume now that the subcarrier signal generator 2 produces a sinusoidal wave subcarrier signal $v_1(t)$ as expressed in the following equation:

$$v_1(v) = V_o + V_s \sin \omega_s t \quad (1)$$

where $V_o \geq V_s > 0$ and where $\omega_s$ designates the angular frequency of the subcarrier signal. Thus, the operational amplifier 7 and the transistor Q9 operate as a voltage follower in the current control circuit 8 and the signal $v_1(t)$ is applied to the resistor R5, so that the current passing through the resistor R5, that is, the current $i_1(t)$ flowing into the current control circuit 8 from the differential transistor pair 3, is expressed as follows:

$$i_1(t) = \frac{V_o}{R5} + \frac{V_s}{R5} \sin \omega_s t \quad (2)$$

$$= I_o + I_s \cdot \sin \omega_s t$$

When the stereo pilot signal has a waveform as shown in FIG. 4(A), the waveform of the current $i_1(t)$ is as shown in FIG. 4(B).

Equation (2) shows that the current control circuit 8 is equivalent to a parallel circuit of a constant current source producing a constant current $I_o$ and another current source producing a current $I_s \cdot \sin \omega_s t$ which varies in accordance with the sinuosoidal wave subcarrier signal.

Similarly to the current control circuit 8, the current control circuit 10 is equivalent to a parallel circuit of a constant current source producing a constant current $I_o$ and another current source producing a current $-I_s \cdot \sin \omega_s t$ which varies in accordance with the signal of opposite phase of the sinusoidal wave subcarrier signal. The current $i_2(t)$ flowing into the current control circuit 10 is expressed by the following equation:

$$i_2(t) = I_o - I_s \sin \omega_s t \quad (3)$$

This current $i_2(t)$ has a waveform as shown in FIG. 4(C).

Now assume that the respective output currents $i_3(t)$ and $i_4(t)$ of the constant current sources 11 and 12 are as follows:

$$i_3(t) = i_4(t) = I_M \quad (4)$$

Thus, the waveform of each of these currents is as shown in FIG. 4(D).

The pulse train signal $u(t)$ produced from the pulse count detector 1 is expressed as follows:

$$u(t) = \tfrac{1}{2} + [K[l(t) + r(t) + \{l(t) - r(t)\} \sin \omega_s t] + f(t)]/2 \quad (5)$$

where K is a constant determined by the FM detection efficiency, l(t) is a left channel signal, r(t) is a right channel signal, and f(t) represents the frequency components near and above the carrier frequency, the pilot signal being omitted for the sake of simplicity. The waveform of this pulse train signal u(t) is as shown in FIG. 4(E).

The two transistors in each of the differential transistors pairs 3, 4, 5 and 6 are alternatively turned off in response to the pulse train signal u(t) so that the collector currents $i_5(t)$ to $i_{12}(t)$ of the respective transistors Q1 and Q8 are as follows:

$$\begin{aligned} i_5(t) = i_1(t) \cdot u(t) = \quad & (6) \\ I_o/2 + I_oK\{l(t) - r(t)\}/2 + & \\ I_sK\{l(t) - r(t)\}/4 + I_s(\sin\omega_s t)/2 + & \\ I_oK\{l(t) - r(t)\}(\sin\omega_s t)/2 + & \\ I_sK\{l(t) - r(t)\}(\sin\omega_s t)/2 + & \\ I_sK\{l(t) - r(t)\}(\cos 2\omega_s t)/4 + & \\ & I_o f(t)/2 + I_s f(t) (\sin\omega_s t)/2, \end{aligned}$$

$$\begin{aligned} i_6(t) = i_1(t) \cdot \{1 - u(t)\} = \quad & (7) \\ I_o/2 - I_oK\{l(t) - r(t)\}/2 - & \\ I_sK\{l(t) - r(t)\}/4 + I_s(\sin\omega_s t)/2 - & \\ I_oK\{l(t) - r(t)\}(\sin\omega_s t)/2 - & \\ I_sK\{l(t) + r(t)\}(\sin\omega_s t)/2 + & \\ I_sK\{l(t) - r(t)\}(\cos 2\omega_s t)/4 - & \\ & I_o f(t)/2 - I_s f(t) (\sin\omega_s t)/2, \end{aligned}$$

$$\begin{aligned} i_7(t) = i_2(t) \cdot \{1 - u(t)\} = \quad & (8) \\ I_o/2 - I_oK\{l(t) + r(t)\}/2 + & \end{aligned}$$

-continued
$$\begin{aligned}&I_sK\{l(t)-r(t)\}/4-I_s(\sin\omega_s t)/2-\\&I_oK\{l(t)-r(t)\}(\sin\omega_s t)/2+\\&I_sK\{l(t)+r(t)\}(\sin\omega_s t)/2-\\&I_sK\{l(t)-r(t)\}(\cos 2\omega_s t)/4-\\&\qquad I_of(t)/2+I_sf(t)(\sin\omega_s t)/2,\end{aligned}$$

$$\begin{aligned}i_8(t)=i_2(t)\cdot u(t)=\quad&(9)\\I_o/2+I_oK\{l(t)+r(t)\}/2-&\\I_sK\{l(t)-r(t)\}/4-I_s(\sin\omega_s t)/2+&\\I_oK\{l(t)-r(t)\}(\sin\omega_s t)/2-&\\I_sK\{l(t)+r(t)\}(\sin\omega_s t)/2+&\\I_sK\{l(t)-r(t)\}(\cos 2\omega_s t)/4+&\\I_of(t)/2-I_sf(t)(\sin\omega_s t)/2,&\end{aligned}$$

$$\begin{aligned}i_9=i_{11}(t)=I_M\cdot u(t)=\quad&(10)\\I_M/2+I_MK\{l(t)+r(t)\}/2+&\\I_MK\{l(t)-r(t)\}(\sin\omega_s t)/2+I_Mf(t)/2,\text{ and}&\end{aligned}$$

$$\begin{aligned}i_{10}(t)=i_{12}(t)=I_M\cdot\{1-u(t)\}=\quad&(11)\\I_M/2-I_MK\{l(t)+r(t)\}/2-&\\I_MK\{l(t)-r(t)\}(\sin\omega_s t)/2-I_Mf(t)/2.&\end{aligned}$$

The waveforms of the currents $i_5(t)$ to $i_8(t)$ are as shown in FIG. 4(F) to FIG. 4(I), and the waveform of each of the currents $i_9(t)$ and $i_{11}(t)$ is as shown in FIG. 4(J).

The current $i_{R3}(t)$ passing through the resistor R3 is the sum of the currents $i_5(t)$, $i_7(t)$ and $i_9(t)$ and therefore can be expressed as follows:

$$\begin{aligned}i_{R3}(t)=I_o+I_M/2+I_MK\{l(t)+r(t)\}/2+&\quad(12)\\I_sK\{l(t)-r(t)\}/2+&\\I_sK\{l(t)+r(t)\}\sin\omega_s t+&\\I_MK\{l(t)-r(t)\}(\sin\omega_s t)/2-&\\I_sK\{l(t)-r(t)\}(\cos 2\omega_s t)/2+&\\I_sf(t)\sin\omega_s t+I_Mf(t)/2.&\end{aligned}$$

Similarly to the current $i_{R3}(t)$, the current $i_{R4}(t)$ passing through the resistor R4 is as follows:

$$\begin{aligned}i_{R4}(t)=I_o+I_M/2+I_MK\{l(t)+r(t)\}/2-&\quad(13)\\I_sK\{l(t)-r(t)\}/2-&\\I_sK\{l(t)+r(t)\}\sin\omega_s t+&\\I_MK\{l(t)-r(t)\}(\sin\omega_s t)/2+&\\I_sK\{l(t)-r(t)\}(\cos 2\omega_s t)/2-&\\I_sf(t)\sin\omega_s t+I_Mf(t)/2.&\end{aligned}$$

If $I_M$ is equal to $I_s$, and considering the band of 0 to 15 kHz, equations (12) and (13) are rearranged as follows:

$$i_{R3}(t)=I_o+I_s/2+I_sKl(t),\quad(14)$$

$$i_{R4}(t)=I_o+I_s/2+I_sKr(t).\quad(15)$$

These equations (14) and (15) show that the signal which is equal to the voltage across the resistor R3 is used as a left channel current to the common collector connection line of the transistors Q1, Q3 and Q5 and the signal which is equal to the voltage across the resistor R4 is used as a right channel current to the common collector connection line of the transistors Q2, Q4 and Q7.

FIG. 5 is a block diagram illustrating another embodiment of the present invention. In FIG. 5, the pulse count detector 1, the subcarrier signal generator 2, the differential transistor pairs 3, 4 and 5, current control circuits 8 and 10, the constant current source 11, resistors R1, R2, R3 and R4, and the power source E1 are connected in the same manner as in the embodiment shown in FIG. 3. In this embodiment, however, the collector of the transistor Q5 in the differential transistor pair 5 is not connected to the collector of a transistor Q1 in the differential transistor pair 3 but is instead supplied with a source voltage +Vcc through a resistor R7. The collector of the transistor Q6 is also supplied with the source voltage +Vcc through a resistor R8. The collector outputs of the respective transistors Q5 and Q6 are applied to the negative and positive input terminals of an operational amplifier 13. A feedback resistor R7 is connected between the negative input and the output terminals of the operational amplifier 13. A voltage E2 is also applied to the positive input terminal of the operational amplifier 13. The operational amplifier 13 and the resistors R7 and R8 constitute a differential amplifier circuit 14. The output of this differential amplifier circuit 14 is applied to a matrix circuit, not shown in this figure, as a main signal composed of the sum of left and right channel signals.

The signal derived at the common collector connection point of the transistors Q1 and Q3 and the signal derived at the common collector connection point of the transistors Q2 and Q4 are respectively applied to the negative and positive input terminals of an operational amplifier 15.

The operational amplifier 15 constitutes, together with resistors R9 and R10, a differential amplifier 16 which is arranged in the same manner as the differential amplifier circuit 14. The output of this differential amplifier circuit 16 is applied to the above-mentioned matrix circuit as a sub-signal composed of difference between the left and right channel signals. The left and right channel signals are obtained in the matrix circuits by taking sums and differences of the main signal and sub-signal.

In the thus arranged circuit, the current $i_{R3}(t)$ passing through the resistor R3 is as follows:

$$\begin{aligned}i_{R3}(t)=i_5(t)+i_7(t)=&\quad(16)\\I_o+I_sK\{l(t)-r(t)\}/2+&\\I_sK\{l(t)+r(t)\}\sin\omega_s t-&\\I_sK\{l(t)-r(t)\}(\cos 2\omega_s t)/2+&\\&I_sf(t)\sin\omega_s t.\end{aligned}$$

Similarly, the current $i_{R4}(t)$ passing through the resistor R4 is as follows:

$$\begin{aligned}i_{R4}(t)=i_6(t)+i_8(t)=&\quad(17)\\I_o-I_sK\{l(t)-r(t)\}/2-&\\I_sK\{l(t)+r(t)\}\sin\omega_s t+&\\I_sK\{l(t)-r(t)\}(\cos 2\omega_s t)/2-&\\&I_sf(t)\sin\omega_s t.\end{aligned}$$

The differential amplifier circuit 16 produces a signal corresponding to the difference between the currents $i_{R3}(t)$ and $i_{R4}(t)$, and the difference current $i_{S1}(t)$ is expressed as follows for the 0–5 kHz band on the basis of the equations (16) and (17):

$$i_{S1}(t)=I_sK\{l(t)-r(t)\}.\quad(18)$$

Similarly, the differential amplifier circuit 14 produces a signal corresponding to the difference between the currents $i_{10}(t)$ and $i_9(t)$, and the difference current $I_{S2}(t)$ is expressed as follows in the 0–5 kHz band on the basis of the equations (10) and (11).

$$i_{S2}(t)=-I_MK\{l(t)+r(t)\}.\quad(19)$$

It is to be understood from equations (18) and (19) that the sub and main signals are produced from the differential amplifier circuits 16 and 14, respectively. The left and right channel $l(t)$ and $r(t)$ signals are then obtained through a matrix circuit not shown in the figure.

Thus, according to the present invention, since a sinusoidal wave subcarrier including no unnecessary high harmonic components is used as a multiplication signal, no beat interference exists in the left and right channel signals demodulated by the multiplication so that it is not necessary to pass the FM detector output through an LPF, thereby preventing any distortion from ocurring.

We claim:

1. An FM stereo demodulating circuit comprising:
   a first differential transistor pair (3) further comprising a first and second transistor with their emitters connected to each other;
   a second differential transistor pair (4) further comprising a third and a fourth transistor with their emitters connected to each other;
   a third differential transistor pair (5) further comprising a fifth and a sixth transistor with their emitters connected to each other;
   a first current control means (2, 8) for controlling a first current supplied to said first differential pair for varying said first current in accordance with a positive phase signal of a sinusoidal subcarrier signal synchronized with a stereo pilot signal in a stereo composite signal which is an FM detection signal;
   a second current control means (2, 9) for controlling a second current supplied to said second differential transistor pair for varying said second current in accordance with a negative phase signal of said sinusoidal subcarrier;
   means (1, $E_1$, $R_1$ and $R_2$) for generating positive and inverted phase pulse train signals having frequency spectrum components of said stereo composite signals, the respective bases of said first, fourth and fifth transistors being supplied with said positive phase pulse train signal and the respective bases of said second, third and sixth transistors being supplied with either said inverted phase pulse train signal or a predetermined bias, whereby a left and a right channel signal are obtained from the respective collector currents of at least said first to fifth transistors.

2. An FM stereo demodulating circuit, as recited in claim 1, wherein said generating means comprises a pulse counter detector and biasing means.

3. An FM stereo demodulating circuit as recited in claim 1, further comprising:
   a first current source (11) connected to the emitters of said fifth and sixth transistor;
   a second current source (12);
   a fourth differential transistor pair (6) further comprising a seventh and eighth transistor having their emitters connected to said second current source, the base of said seventh transistor being supplied with said positive phase pulse train signal and the base of said eighth transistor being supplied with said inverted phase pulse train signal; and wherein
   the collectors of said sixth and eighth transistors are connected to a given voltage;
   the collectors of said first, third and fifth transistors are connected and separated from said given voltage by a first resistor (R3), whereby the voltage on said collectors is one of said channel signals; and
   the collectors of said second, fourth and seventh transistors are connected and separated from said given voltage by a second resistor (R4), whereby the voltage on said collectors is the other of said channel signals.

4. An FM stereo demodulating circuit, as recited in claim 1, further comprising:
   a current source (11) connected to the emitters of said fifth and sixth transistor;
   a first differential amplifier circuit (14) whose inputs are respectively connected to the collectors of said fifth and sixth transistors, whereby the output of said amplifier is a main signal of said left and right channel signals; and
   a second differential amplifier circuit (16), one of whose inputs is connected to the collectors of said first and third transistors, and the other input is connected to the collectors of said second and fourth transistor, whereby the output of said amplifier is a sub-signal of said left and right channel signals.

* * * * *